(12) United States Patent
Noh et al.

(10) Patent No.: US 7,566,148 B2
(45) Date of Patent: Jul. 28, 2009

(54) SIDE LIGHT-EMITTING DEVICE, BACKLIGHT UNIT HAVING THE SIDE LIGHT-EMITTING DEVICE, AND LIQUID CRYSTAL DISPLAY APPARATUS EMPLOYING THE BACKLIGHT UNIT

(75) Inventors: Ji-whan Noh, Suwon-si (KR); Dong-ha Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 267 days.

(21) Appl. No.: 11/265,197

(22) Filed: Nov. 3, 2005

(65) Prior Publication Data

US 2006/0109685 A1    May 25, 2006

(30) Foreign Application Priority Data

Nov. 24, 2004    (KR)    ............. 10-2004-0097022

(51) Int. Cl.
  *F21V 7/00*    (2006.01)
(52) U.S. Cl. ............... 362/305; 362/307; 362/334; 362/338; 362/97; 362/613
(58) Field of Classification Search .......... 362/97, 362/611–613, 305, 307, 327, 329, 334–335, 362/338; 349/61, 67, 64; 313/110–112, 313/501; 257/98–100; 359/514, 838–884
See application file for complete search history.

(56) References Cited

U.S. PATENT DOCUMENTS

| | | | |
|---|---|---|---|
| 2,344,221 A * | 3/1944 | Wagn | ............ 362/297 |
| 6,065,846 A | 5/2000 | Kato et al. | |
| 6,473,554 B1 | 10/2002 | Pelka et al. | |
| 6,582,103 B1 * | 6/2003 | Popovich et al. | ........... 362/307 |
| 6,598,998 B2 * | 7/2003 | West et al. | .............. 362/307 |
| 6,674,096 B2 * | 1/2004 | Sommers | ................. 257/98 |
| 6,972,439 B1 * | 12/2005 | Kim et al. | .............. 257/98 |
| 7,083,313 B2 * | 8/2006 | Smith | ............... 362/555 |
| 7,142,769 B2 * | 11/2006 | Hsieh et al. | .............. 385/146 |
| 2004/0212998 A1 * | 10/2004 | Mohacsi | .............. 362/294 |

(Continued)

FOREIGN PATENT DOCUMENTS

JP    60-6258    1/1985

(Continued)

*Primary Examiner*—Jong-Suk (James) Lee
*Assistant Examiner*—Julie A Shallenberger
(74) *Attorney, Agent, or Firm*—Shanzione & Kim LLP

(57) ABSTRACT

A side light-emitting device including a light-emitting device to generate light and a side emitter to emit the light incident from the light-emitting device in a lateral direction. The side emitter includes a first reflecting surface to reflect the light emitted from the light-emitting device into the side emitter, a second reflecting surface that is formed at a portion of the side emitter that contacts the light-emitting device to reflect a first light that is reflected from the first reflecting surface in the lateral direction, and a refracting surface to refract a second light that is reflected from the first reflecting surface and proceeding directly toward the refracting surface and the first light that is reflected from the first reflecting surface to the second reflecting surface and is reflected again from the second reflecting surface to exit the side emitter in the lateral direction.

52 Claims, 6 Drawing Sheets

U.S. PATENT DOCUMENTS

| | | | |
|---|---|---|---|
| 2004/0233665 A1* | 11/2004 | West et al. | 362/245 |
| 2006/0077685 A1* | 4/2006 | Hsieh et al. | 362/558 |
| 2006/0083003 A1* | 4/2006 | Kim et al. | 362/327 |
| 2006/0226436 A1* | 10/2006 | Liu et al. | 257/98 |
| 2007/0109791 A1* | 5/2007 | Chinniah et al. | 362/334 |

FOREIGN PATENT DOCUMENTS

| | | |
|---|---|---|
| JP | 64-54204 | 4/1989 |
| JP | 5-36857 | 5/1993 |
| JP | 9-152310 | 6/1997 |
| JP | 2004-87630 | 3/2004 |
| JP | 2004-88007 | 3/2004 |
| KR | 2004-4118 | 1/2004 |

\* cited by examiner

SIDE LIGHT-EMITTING DEVICE, BACKLIGHT UNIT HAVING THE SIDE LIGHT-EMITTING DEVICE, AND LIQUID CRYSTAL DISPLAY APPARATUS EMPLOYING THE BACKLIGHT UNIT

CROSS-REFERENCE TO RELATED APPLICATIONS

This application claims the benefit of Korean Patent Application No. 2004-97022, filed on Nov. 24, 2004, in the Korean Intellectual Property Office, the disclosure of which is incorporated herein in its entirety by reference.

BACKGROUND OF THE INVENTION

1. Field of the Invention

The present general inventive concept relates to a side light-emitting device, a backlight unit that uses the side light-emitting device as a light source, and a liquid crystal display (LCD) apparatus employing the backlight unit.

2. Description of the Related Art

An LCD is a passive flat panel display that uses an external light source to produce an image. A backlight unit is used as the external light source and is located behind the LCD and emits light.

Backlight units can be classified as direct light type backlight units or edge light type backlight units according to a position of the light source. In the direct light type backlight unit, a plurality of light sources are disposed behind an LCD to directly emit light onto a liquid crystal panel. In the edge light type backlight unit, the light source is located along a sidewall of a light guide panel (LGP) to emit light onto the liquid crystal panel via the LGP.

The direct light type backlight unit may use light-emitting diodes (LEDs) as a point light source that emit Lambertian light. In order to prevent color light emitted from an LED from being directly visible above a diffusion plate when the light emitted by the LED is diffused by the diffusion plate and to illuminate the liquid crystal panel, a side-emitting LED is used to direct the light emitted by the LED to propagate into the diffusion plate in a direction that is slightly lateral.

U.S. Pat. No. 6,679,621 provides a side-emitting LED designed such that light generated by an LED junction is emitted from a side thereof by a conventional side emitter.

The conventional side emitter proposed in the above-cited reference includes a total reflecting portion and a refracting portion. That is, the conventional side emitter includes a funnel-shaped reflecting surface sloped with respect to a central axis thereof, a first refracting surface obliquely angled with respect to the central axis to refract light reflected from the reflecting surface, and a second refracting surface extending as a convex curve or sawtooth shape from a bottom surface of the conventional side emitter to the first refracting surface.

However, the sawtooth-shape side portion of the conventional side emitter is difficult to manufacture. FIG. 1 illustrates the conventional side emitter 1 (described above).

Referring to FIG. 1, the conventional side-emitter 1 includes the funnel-shaped reflecting surface 3 sloped with respect to the central axis c', the first refracting surface 5 obliquely angled with respect to the central axis c' to refract light reflected from the reflecting surface 3, and the second refracting surface 7 extending as the convex curve from the bottom surface 9 to the first refracting surface 5.

Light that is emitted from an LED (not shown) propagates into the conventional side emitter 1 and is incident on the reflecting surface 3. The light is reflected by the reflecting surface 3 to the first refracting surface 5 and is refracted by the first refracting surface 5 to exit the conventional side emitter 1 in a substantially lateral direction.

FIG. 2 illustrates an intensity distribution of light emitted from the conventional side emitter 1 in the side-emitting LED. As illustrated in FIG. 2, in the conventional side-emitter 1, not all light is emitted parallel to a horizontal axis and light that propagates along a path that is about 10° upward from the horizontal axis has the highest intensity. The light must be spread over a wider area in order to obtain a slim backlight unit and a uniform screen brightness. However, the side-emitting LED having the conventional side-emitter 1 does not satisfy this requirement.

Another drawback of the side-emitting LED having the conventional side-emitter 1 is that it is difficult to manufacture due to the complicated structure including the reflecting surface 3, the first refracting surface 5, and the second curved refracting surface 7.

SUMMARY OF THE INVENTION

The present general inventive concept provides a side light-emitting device that is easy to manufacture and spreads light over a wide area, a slim backlight unit that uses the side light-emitting device as a light source, and a liquid crystal display (LCD) apparatus employing the backlight unit.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a side light-emitting device including a light-emitting device to generate light and a side emitter to emit the light incident from the light-emitting device in a lateral direction. The side emitter includes a first reflecting surface to reflect the light emitted from the light-emitting device into the side emitter, a second reflecting surface that is formed at a portion of the side emitter that contacts the light-emitting device to reflect a first light reflected from the first reflecting surface in the lateral direction, and a refracting surface to refract a second light that is reflected from the first reflecting surface and proceeds directly toward the refracting surface and the first light that is reflected from the first reflecting surface to the second reflecting surface and is reflected again from the second reflecting surface to exit the side emitter in the lateral direction.

At least one of the first and second reflecting surfaces may be coated with a reflective coating. The first reflecting surface may comprise a conical surface centered around a central axis of the side light-emitting device to reflect incident light in a direction away from the central axis. The second reflecting surface may also comprise a conical surface having a distance from the first reflecting surface that varies and increases as the second reflecting surface extends away from the central axis. The first and second reflecting surfaces may be inclined in opposite directions with respect to an axis that is perpendicular to the central axis. Either the first or second reflecting surface may be symmetric about the central axis of the side light-emitting device. The second reflecting surface may have slighter inclination than the first reflecting surface. The second reflecting surface may be planar. The refracting surface may not be parallel to the central axis of the side light-emitting device.

The foregoing and/or other aspects of the present general inventive concept are also achieved by providing a side light emitting device, comprising a side emitter having a central axis, a reflective surface extending at an inner end at 360 degrees from the central axis at an incline with respect to a lateral axis perpendicular to the central axis, and a cylindrical refractive surface connected at an outer end at 360 degrees to the reflective surface, the refractive surface being substantially parallel to the perpendicular axis to receive light beams reflected from the reflective surface and to transmit the reflected light beams out of the side emitter along the lateral axis.

The foregoing and/or other aspects of the present general inventive concept are also achieved by providing a side light emitting device, comprising a point light source, and a side emitter having first and second reflective surfaces extending away from a central axis of the side light emitting device and having a predetermined distance therebetween that increases as the first and second reflective surfaces extend away from the central axis of the side light emitting device.

The foregoing and/or other aspects of the present general inventive concept are also achieved by providing a side emitter usable in a side light emitting device, comprising a transparent body having a substantially cylinder shaped lateral boundary and a cone shaped upper boundary extending downward into the cylinder shaped lateral boundary such that the side emitter receives light from a point light source disposed therebelow into a region around a vertex of the cone shaped upper boundary.

The foregoing and/or other aspects of the present general inventive concept are also achieved by providing a side light emitting device, comprising a side emitter, including a transparent body, the transparent body being bound at an upper part by a first reflective surface and a lower part by a second reflective surface such that the first and second reflective surfaces meet at a central axis of the transparent body and have first and second inclinations with respect to a lateral axis, respectively, and at an outer side part by a planar refractive surface to connect the first and second reflective surfaces opposite to the central axis.

The foregoing and/or other aspects of the present general inventive concept are also achieved by providing a backlight unit including an array of the side light-emitting devices (described above) disposed on a base plate, a reflective diffusion plate disposed on a lower side of the side light-emitting devices to reflect and diffuse incident light that propagates downward, and a first transmissive diffusion plate disposed above the side light-emitting devices to transmit and diffuse incident light that propagates upward.

The array of the side light-emitting devices may include one of an alternating arrangement of the side light-emitting devices to emit red, green, blue color light beams, respectively, and the plurality of the side light-emitting devices to emit white light.

The backlight unit may further include an optical plate and a plurality of reflecting mirrors that are disposed on one surface of the optical plate to reflect light that is emitted directly upward from the side light-emitting devices that correspond thereto. The optical plate may comprise one of a transparent polymethyl methacrylate (PMMA) and a second transmissive diffusion plate.

The backlight unit may further include at least one of a brightness enhancement film (BEF) to improve a directionality of light beams passing through the first transmissive diffusion plate, and a polarization enhancement film to increase efficiency of polarization.

The foregoing and/or other aspects of the present general inventive concept are also achieved by providing a backlight unit usable with a display panel apparatus, the backlight unit comprising a base plate, and a plurality of side light emitting devices disposed on the base plate to emit light beams. Each of the plurality of side light emitting devices includes a point light source, and a side emitter having first and second reflective surfaces extending away from a central axis of the side light emitting device and having a predetermined distance therebetween that increases further away from the central axis of the side light emitting device.

The foregoing and/or other aspects of the present general inventive concept are also achieved by providing a liquid crystal display apparatus including a liquid crystal panel, and the backlight unit (described above) to emit light beams to the liquid crystal panel.

The foregoing and/or other aspects of the present general inventive concept are also achieved by providing a display panel apparatus, comprising a display panel, and a backlight unit disposed adjacent to the display panel and to provide light to the display panel. The backlight unit includes a base plate, and a plurality of side light emitting devices disposed on the base plate to emit light beams. Each of the plurality of side light emitting devices have a point light source, and a side emitter having first and second reflective surfaces extending away from a central axis of the side light emitting device and having a predetermined distance therebetween that increases while extending further away from the central axis of the side light emitting device.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
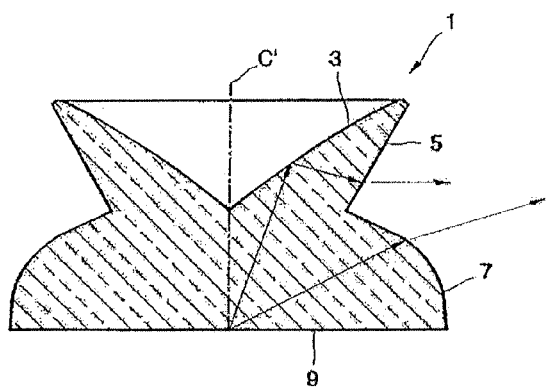
FIG. 1 is a cross-sectional side view illustrating a conventional side emitter of a side-emitting LED.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

A side light-emitting device, a backlight unit that uses the side light-emitting device as a light source, and a liquid crystal display (LCD) apparatus employing the backlight unit according to various embodiments of the present general inventive concept will now be described with reference to the accompanying drawings.

Figure 3:
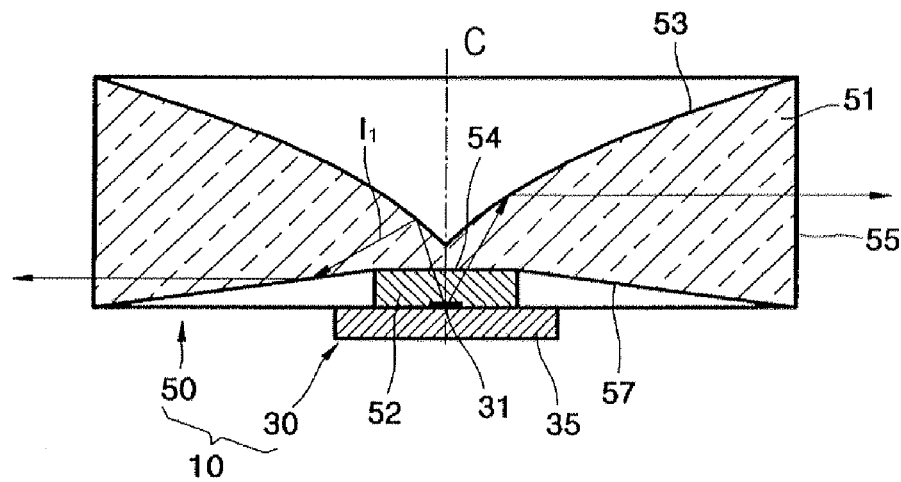
FIG. 3 is a schematic side view illustrating a side light-emitting device according to an embodiment of the present general inventive concept.
Figure 4A:
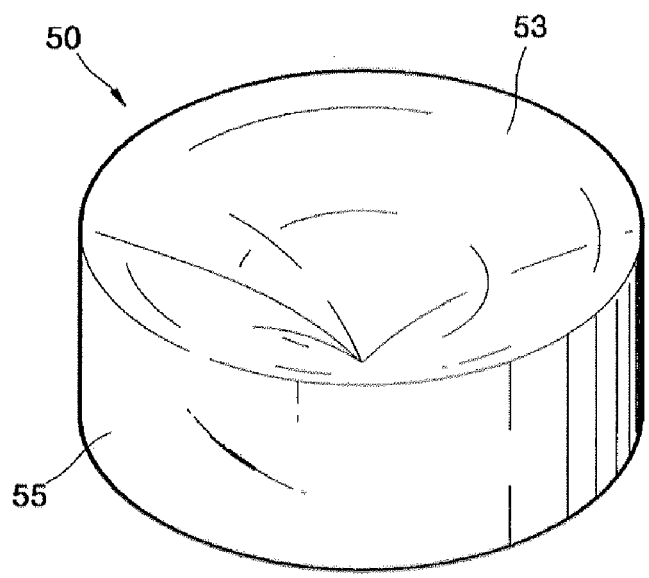
FIGS. 4A and 4B are perspective views illustrating the side emitter of FIG. 3.
Figure 4B:
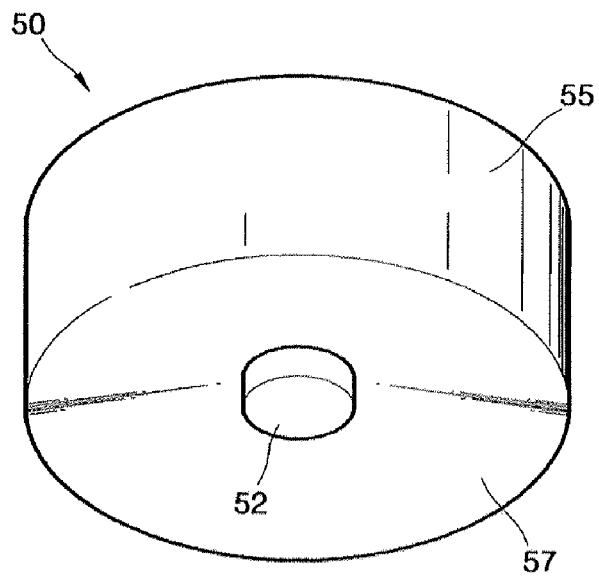

Referring to FIGS. 3 and 4B, a side light-emitting device 10 according to an embodiment of the present general inventive concept includes a light-emitting device 30 to generate light and a side emitter 50 to emit the generated light incident from the light-emitting device 30 in a lateral direction.

A principal propagation direction of light emitted from the light-emitting device 30 substantially corresponds to a central axis C of the side light-emitting device 10. The lateral direction is a direction that is parallel or substantially parallel to a horizontal axis and perpendicular to the central axis C. Here, the central axis C is an axis that crosses a center of a light-emitting diode (LED) chip 31 (described below), and a center of the side emitter 50.

The light-emitting device 30 includes the LED chip 31 to generate Lambertian light and is combined with the side emitter 50 when the LED chip 31 is mounted on a base 35. The LED chip 31 may be disposed in close contact with the side emitter 50 in order to maximize the amount of light that is emitted by the LED chip 31 into the side emitter 50.

The side emitter 50 includes a transparent body 51 made of a transparent material, such as a transparent plastic material, first and second reflecting surfaces 53 and 57 to reflect incident light, and a refracting surface 55 to refract the light reflected from the first and second reflecting surfaces 53 and 57 so that the refracted light propagates in the lateral direction. A range in which light is incident into the side emitter 50 is restricted by an incident region 54 located at a center of the second reflecting surface 57. The incident region 54 has a predetermined size and is located on the central axis C of the side light-emitting device 10.

The first and second reflecting surfaces 53 and 57 and the refracting surface 55 are the surfaces of the transparent body 51.

The first reflecting surface 53 reflects light that is emitted from the light-emitting device 30 and is incident into the side emitter 50. When the light-emitting device 30 is disposed below the side emitter 50, relatively speaking with respect to the positioning as illustrated in FIG. 3, the first reflecting surface 53 corresponds to a top surface of the side emitter 50 and may be a conical surface centered on the central axis C so as to reflect the incident light in a direction away from the central axis C. More specifically, the conical surface of the first reflecting surface 53 may be inclined upward from the horizontal axis. The first reflecting surface 53 may be planar or concavely curved and may be obtained by applying a reflective coating to the top surface of the side emitter 50 in order to reflect the incident light.

Light that is emitted from the light-emitting device 30 and is incident on the first reflecting surface 53 at a small incident angle with respect to the central axis C (i.e., on a portion of the first reflecting surface 53 close to the central axis C) is reflected downward by the first reflecting surface 53. On the other hand, light incident on the first reflecting surface 53 at a large incident angle with respect to the central axis C (i.e., on a portion of the first reflecting surface 53 away from the central axis C) is reflected from the first reflecting surface 53 toward the refracting surface 55.

The second reflecting surface 57 is disposed opposite to the first reflecting surface 53 of the transparent body 51 and reflects the light reflected downward by the first reflecting surface 53 to the refracting surface 55. That is, the second reflecting surface 57 is formed at a portion of the side emitter 50 that is in contact with the light-emitting device 30.

Like the first reflecting surface 53, the second reflecting surface 57 may be obtained by applying a reflective coating on a bottom of the side emitter 50, relatively speaking with respect to the positioning as illustrated in FIG. 3. Alternatively, the second reflecting surface 57 may be formed to be a total internal reflecting surface since an incident angle of light reflected from the first reflecting surface 53 to the second reflecting surface 57 can be sufficiently large to satisfy the condition for total internal reflection as indicated by a light path $I_1$ illustrated in FIG. 3.

To reflect light to the refracting surface 55, the second reflecting surface 57 may be conically shaped surface such that a distance of the second reflecting surface 57 from the first reflecting surface 53 increases as it extends away from the central axis C of the side light-emitting device 10. More specifically, the second reflecting surface 57 may be inclined downward with respect to the horizontal axis. That is, the first and second reflecting surfaces 53 and 57 may be inclined in the opposite directions with respect to the horizontal axis that is perpendicular to the central axis C of the side light-emitting device 10. The first and/or second reflecting surfaces 53 or 57 may be symmetric about the central axis C. As illustrated in FIG. 3, the second reflecting surface 57 may have a slighter inclination than the first reflecting surface 53.

The refracting surface 55 corresponds to a side surface of the side emitter 50 and refracts incident light to exit the side emitter 50 in the lateral direction. Light may be reflected from the first reflecting surface 53 directly to the refracting surface 55 or may be reflected from the second reflecting surface 57 to the refracting surface 55 after being reflected from the first reflecting surface 53.

Figure 9A:
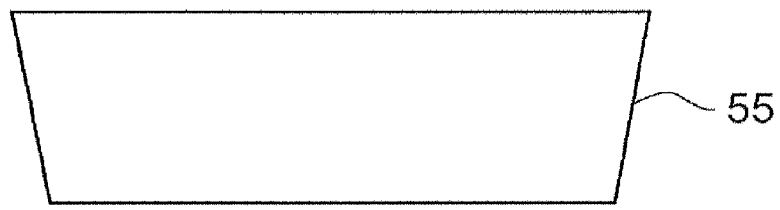
FIG. 9A and FIG. 9B illustrate examples of the peripheral edge inclinations.
Figure 9B:
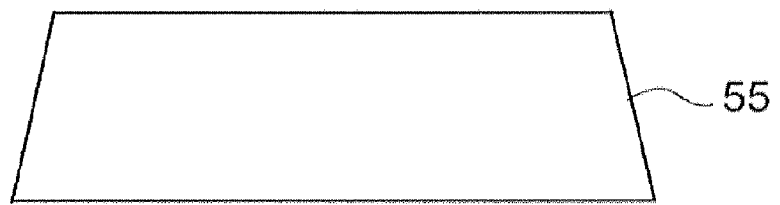

As shown in FIGS. 9A and 9B, the refractive surface 55 may be slightly inclined in a positive (+) or negative (−) direction with respect to the central axis C. Thus, the side emitter 50 may be easily molded, since the refracting surface 55 is formed to be non-parallel to the central axis C. An angle of the refracting surface 55 with respect to the central axis C may be designed to be within a wide range of angles such that as much light as possible exits the side emitter 50 in the lateral direction and the light is spread out over a wide area. Alternatively, the refracting surface 55 may be parallel to the central axis C of the side light-emitting device 10.

Each of the first and second reflecting surfaces 53 and 57 and the refracting surface 55 may be symmetric about the central axis C so that the side emitter 50 can emit light incident from the light-emitting device 30 uniformly in the lateral direction.

A projection 52 may be further disposed on a center portion of the second reflecting surface 57 and acts as a connector between the light-emitting device 30 and the side emitter 50. The projection 52 is used in combination with the incident region 54 to restrict the range of light emitted from the light-emitting device 30 into the side emitter 50. The projection 52 having a predetermined thickness extends downward from the incident region 54.

The projection 52 enables light to be emitted from the light-emitting device 30 onto the first reflecting surface 53 of the side emitter 50 over a broad range and to spread out over a larger area while not increasing an overall thickness of the side emitter 50.

That is, since the light emitted from the LED chip 31 spreads out in all directions, the LED chip 31 must be separated from the first reflecting surface 53 by a predetermined distance to increase the range of light incident on the first reflective surface 53.

When the side light-emitting device 10 does not include the projection 52, a minimum distance between the LED chip 31 and the first reflecting surface 53 must be greater than or equal to the predetermined thickness of the projection 52 in order to emit light on the first reflecting surface 53 over a broad range, as desired. Referring to FIG. 3, the LED chip 31 is located in close proximity to the incident region 54 that is formed on the same plane as the second reflecting surface 57. Thus, in this case, a distance between the incident region 54 and the first reflecting surface 53 should be increased to emit light on the first reflecting surface 53 over the broad range, as desired, thereby resulting in an increased overall thickness of the side emitter 50.

Conversely, when the side light-emitting device 10 includes the projection 52, it is possible to emit light over a sufficiently broad range while decreasing the overall thickness of the side emitter 50, since the projection 52 can be located within a space created by the conical second reflecting surface 57 that is inclined downward with respect to the horizontal axis, as illustrated in FIGS. 3 and 4B.

Figure 5:
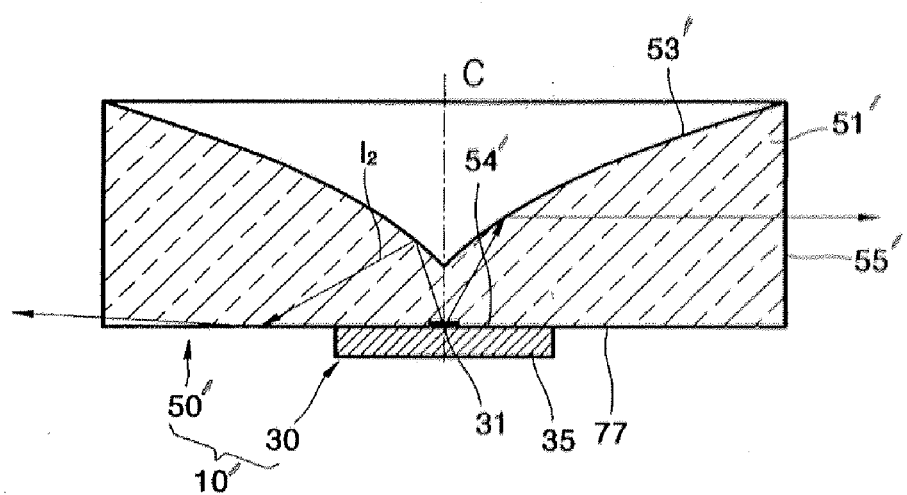
FIG. 5 is a schematic side view illustrating a side light-emitting device according to another embodiment of the present general inventive concept.

While FIGS. 3 and 4B illustrate that the side light-emitting device 10 includes the second reflecting surface 57 that is a conical surface inclined downward with respect to the horizontal axis and the projection 52, the side light-emitting device 10 may alternatively include a planar second reflecting surface 77 that is perpendicular to the central axis C as illustrated in FIG. 5. In this case, it is possible to omit the projection 52 as illustrated in FIG. 5.

FIG. 5 is a schematic side view illustrating a side light-emitting device 10' according to another embodiment of the present general inventive concept. Referring to FIG. 5, like the second reflecting surface 57 described and illustrated in the embodiment of FIG. 3, the second reflecting surface 77 reflects light reflected downward by a first reflecting surface 53' to a refracting surface 55'. The second reflecting surface 77 may also be obtained by applying a reflective coating on a bottom of the side emitter 50' or may be a total internal reflecting surface since an incident angle of the light reflected from the first reflecting surface 53' to the second reflecting surface 77 can be sufficiently large to satisfy the condition for total internal reflection as indicated by a light path $I_2$ illustrated in FIG. 5.

The side light-emitting device 10' having the structure described above and is illustrated in FIG. 5 is able to emit most of the light in the lateral direction (i.e., in the direction of the horizontal axis).

Using the side light-emitting device 10 or 10' as a point light source in a backlight unit allows light to be emitted over a broader area, thereby reducing a thickness of the backlight unit. Furthermore, the side light-emitting device 10 is easy to manufacture, since it has a simple structure with only the first and second reflecting surfaces 53 (53') and 57 (77) and the refracting surface 55 (55') that is nearly parallel to the central axis C.

Figure 6:
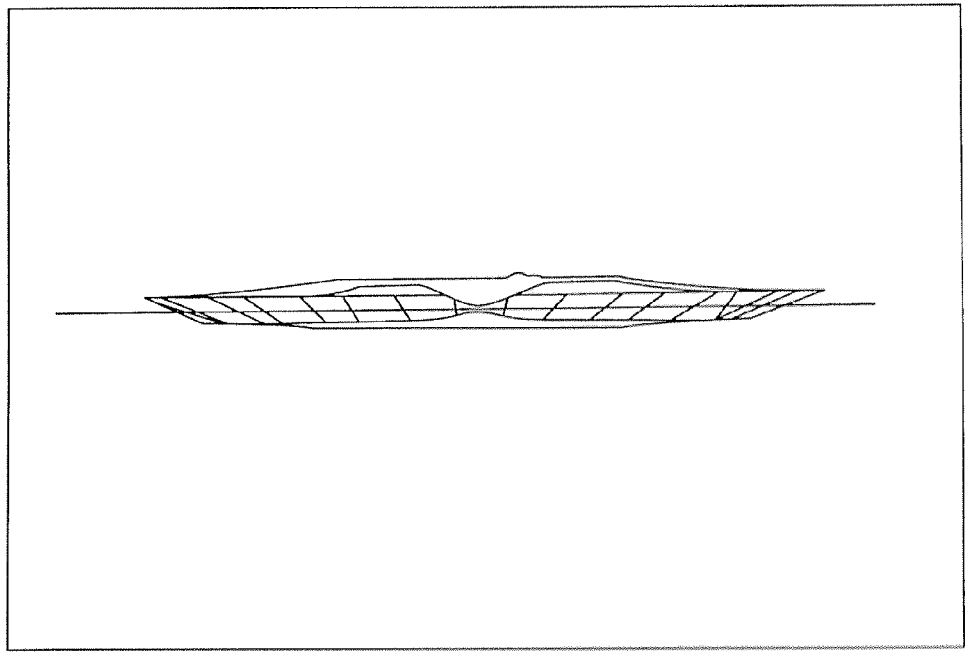
FIG. 6 illustrates an intensity distribution of light emitted from the side emitter in the side light-emitting device of FIGS. 3-4B.

FIG. 6 illustrates an intensity distribution of light emitted from the side emitter 50 in the side light-emitting device 10 (10') illustrated in FIGS. 3, 4A, 4B, and 5. As illustrated in FIG. 6, in the side light-emitting device 10 (10') according to the present embodiments, light propagating in the lateral direction nearly parallel to the horizontal axis has the highest intensity and most light is distributed in the lateral direction almost parallel to the horizontal axis. Various embodiments of a backlight unit and an LCD apparatus employing the same (described below) use the side light-emitting device 10 (10') to direct light to be spread out over a sufficiently wide area, thereby allowing the backlight unit to be made to have a small thickness and the LCD to have uniform screen brightness.

Figure 2:
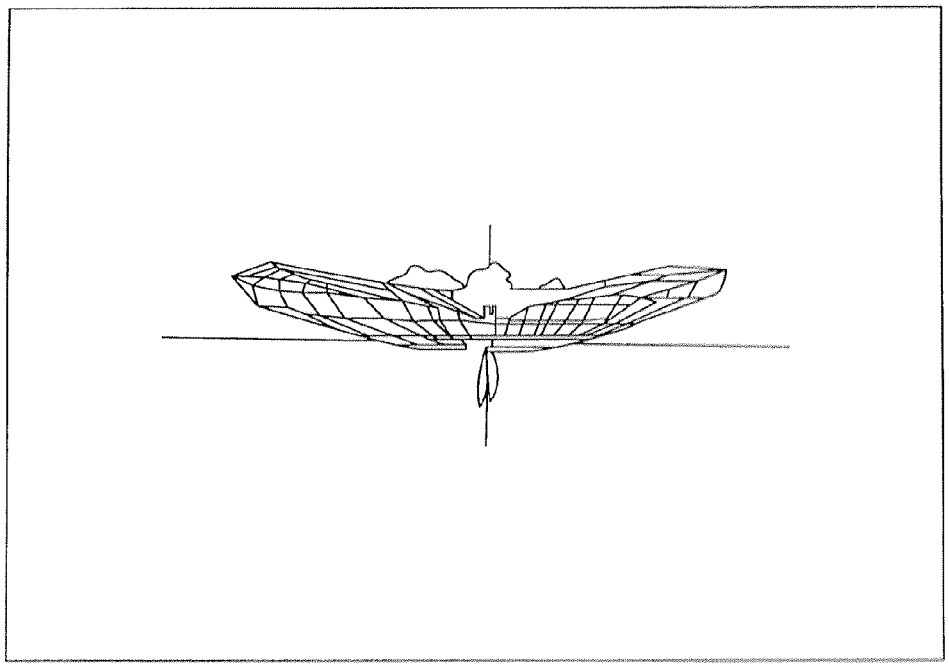
FIG. 2 illustrates an intensity distribution of light emitted from the conventional side emitter in the side-emitting LED of FIG. 1.

As evident from FIGS. 2 and 6, light that propagates along a path that is about 10° upward from the horizontal axis has the highest intensity in the conventional side emitter 1 of the side-emitting LED illustrated in FIG. 1, while light propagating in the direction of the horizontal axis has the highest intensity in the side emitter 50 (50') of the various embodiments of the present general inventive concept.

When the side-emitting LED having the conventional side emitter 1 is used in a direct type backlight unit, a distance between the side-emitting LED and a transparent diffusion plate must be large in order to widely spread light. That is, the thickness of the backlight unit may need to be significantly increased to provide a uniform screen brightness.

Conversely, when the side light-emitting device 10 (10') having the side emitter 50 (50') of the various embodiments of the present general inventive concept is used in the backlight unit and the LCD apparatus employing the backlight unit, it is possible to provide a uniform screen brightness while keeping the thickness of the backlight unit to a minimum, since the side light-emitting device 10 (10') spreads out light over a sufficiently wide area.

Figure 7:
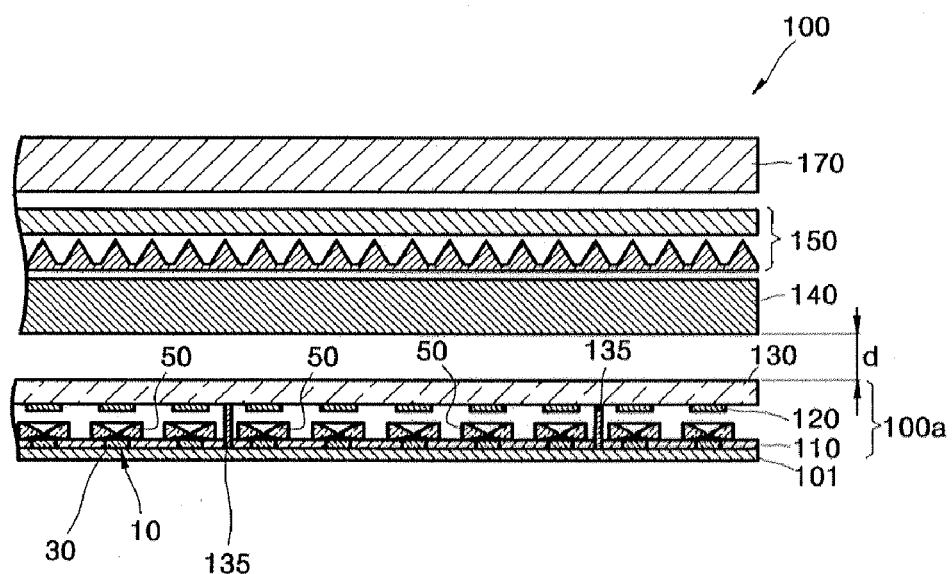
FIG. 7 schematically illustrates a backlight unit having an array of side light-emitting devices according to an embodiment of the present general inventive concept.

FIG. 7 schematically illustrates a backlight unit 100 having an array (i.e., a two-dimensional array) of side light-emitting devices 10 (10') according to an embodiment of the present general inventive concept. Referring to FIG. 7, the backlight unit 100 includes a plurality of side light-emitting devices 10 (10') arranged in an array on a base plate 101, a reflective diffusion plate 110 that is disposed on a lower side of the plurality of side light-emitting devices 10 (10') to reflect and diffuse light emitted from the side light-emitting devices 10, and a transmissive diffusion plate 140 that is disposed above the side light-emitting devices 10 (10') to transmit and diffuse incident light.

The base plate 101 serves as a substrate on which the plurality of side light-emitting devices 10 (10') are arranged in the array. The base plate 101 may be a printed circuit board (PCB) to drive the side light-emitting devices 10 (10'). Alternatively, the backlight unit 100 may include the base plate 101 and a PCB to drive the side light-emitting devices 10 (10') separately.

The side light-emitting device 10 (10') may be the side light-emitting device described above with reference to FIGS. 3-6 to direct most of the Lambertian light emitted from the LED chip 31 disposed at a lower portion thereof to be emitted by the side emitter 50 (50') in the lateral direction.

The array of the plurality of side light-emitting devices 10 (10') may include the side light-emitting devices 10 (10') alternately arranged, each to emit a red (R), green (G), or blue (B) color beam. In this case, each of the side light-emitting devices 10 (10') includes the LED chip 31 (see FIGS. 3 and 5) to generate a R, G, or B color beam of colored light.

The two-dimensional array of the side light-emitting devices 10 (10') arranged on the base plate 101 is subdivided into a plurality of lines. A number of the side light-emitting devices 10 (10') for each color light arranged on each line may vary depending on an amount of the colored light beams emitted therefrom.

The amount of R, G, and B color light beams emitted from the corresponding LED chips 31 may be different from one another. For example, the amount of green light emitted from the green LED chip 31 may typically be lower than that of red or blue light emitted from the red or blue LED chips 31, respectively. Thus, a number of red light-emitting devices 30 for each line may be equal to that of blue light-emitting devices 30, and a number of green light-emitting devices 30 may be double the number of red or blue light-emitting devices 30. The red, green, and blue light-emitting devices 30 may be arranged along each line in the order of R, G, G, B or B, G, G, R.

Alternatively, the side light-emitting devices 10 (10') may all emit white light. In this case, each of the side light-emitting devices 10 (10') includes the LED chip 31 to generate white light.

When the backlight unit 100 includes the array of the plurality of light-emitting device units 10 (10'), alternately arranged, each containing the LED chips 31 to generate the R, G, and B color light beams or when the backlight unit 100 includes the array of the plurality of light-emitting device units 10 (10') with the LED chips 31 to generate the white light, the LCD apparatus employing the backlight unit 100 enables the display of a color image.

The reflective diffusion plate 110 reflects and diffuses incident light so that the reflected light propagates upward. The reflective diffusion plate 110 is disposed on the base plate 101 and is positioned at a lower side of the side light-emitting devices 10 (10'). Accordingly, the reflective diffusion plate 110 may have a plurality of holes in which the corresponding side light-emitting devices 10 (10') can be disposed. The reflective diffusion plate 110 may be disposed on the base plate 101 with the side light-emitting devices 10 (10') being inserted into the plurality of holes.

Here, most of the light emitted from the side emitter 50 in the side light-emitting device 10 (10') propagates over a long distance and is then incident on the reflective diffusion plate 110. Some of the light emitted from the side emitter 50 (50') propagates a long distance and is then incident on a reflecting mirror 120 (described below) disposed above the side light-emitting devices 10 (10') or on the transmissive diffusion plate 140 disposed above the reflecting mirror 120.

Thus, the light may be directly emitted from the side emitter 50 (50') onto the reflective diffusion plate 110 or may be reflected by the reflecting mirror 120 to the reflective diffusion plate 110.

The transmissive diffusion plate 140 is spaced apart from a lower portion 100a of the backlight unit 100 (i.e., the side light-emitting devices 10 (10') and the reflective diffusion plate 110) by a predetermined distance "d." The transmissive diffusion plate 140 transmits and diffuses incident light.

In this case, when the transmissive diffusion plate 140 is too close to the side light-emitting devices 10 (10'), a region where the side light-emitting device 10 (10') is located appears brighter than a remaining region, resulting in a degradation of brightness uniformity. Furthermore, when a distance between the transmissive diffusion plate 140 and the side light-emitting device 10 (10') increases, the thickness of the backlight unit 100 increases. Thus, the distance "d" between the transmissive diffusion plate 140 and the lower portion 100a of the backlight unit 100, which includes the side light-emitting device 10 (10') and the reflective diffusion plate 110, may be minimized within a range in which light can be sufficiently mixed as desired.

The backlight unit 100 using the side light-emitting device 10 (10') to emit light over a wide area as a light source has a reduced thickness compared to a conventional backlight unit, because due to optical characteristics of the side emitter 50 (50'), light can be sufficiently mixed even though the distance between the side light-emitting device 10 (10') and the transmissive diffusion plate 140 is reduced.

While most of the light generated by the light-emitting device 30 in the side light-emitting device 10 (10') is emitted by the side emitter 50 (50') in the lateral direction, light propagating upward in the side emitter 50 (50') may also be present when the first reflecting surface 53 (see FIGS. 3, 4A, and 5) of the side emitter 50 (50') is not a total reflecting surface. Since coating conditions for forming a total reflecting surface are difficult to satisfy, coating is substantially formed on the first reflecting surface 53 to have a proper reflectance. Thus, some of the light may propagate directly upward through the side emitter 50 (50').

Due to the presence of the light propagating upward through the side emitter 50 (50'), a light spot that corresponds to a position of the LED chip 31 (see FIGS. 3 and 5) that corresponds to the light emitting device 30 is visible from above the backlight unit 100. Furthermore, when the R, G, and B LED chips 31 to emit each color light are used to display the color image, the colors of the LED chips 31 may be seen from above the backlight unit 100.

Thus, to prevent the problems resulting from the presence of the light propagating upward through the side emitter 50 (50'), the backlight unit 100 further includes a plurality of reflecting mirrors 120 that are disposed on one surface of an optical plate 130 to reflect light emitted directly upward from the side light-emitting devices 10 (10'). An array of the plurality of reflecting mirrors 120 that corresponds to the array of the side light-emitting devices 10 (10') are arranged on the surface of the optical plate 130. That is, each of the plurality of reflecting mirrors 120 is disposed above the corresponding side light-emitting device 10 (10') to reflect light downward.

The optical plate 130 on which the plurality of reflecting mirrors 120 are arranged may be made of transparent polymethyl methacrylate (PMMA) to transmit incident light. Alternatively, the optical plate 130 may be a transmissive diffusion plate.

In this case, each of the plurality of reflecting mirrors 120 may be spaced apart from the corresponding side light-emitting device 10 (10') by a predetermined distance. To maintain the predetermined distance, the optical plate 130 may be supported by a support 135. The support 135 supports the optical plate 130 relative to the reflective diffusion plate 110 and/or the base plate 101.

Using the transmissive diffusion plate as the optical plate 130 allows light to be spread out more effectively as compared to using only the reflective diffusion plate 110 and the transmissive diffusion plate 140, thereby further reducing the distance between the transmissive plate 140 and the side light-emitting device 10 (10') (i.e., and the distance "d" between the transmissive diffusion plate 140 and the lower portion 100a of the backlight unit 100). This results in a reduction in the thickness of the backlight unit 100.

However, when the transmissive diffusion plate is used as the optical plate 130, transmittance of light is lower than when transparent PMMA is used as the optical plate 130. Thus, either the transmissive diffusion plate or the transparent PMMA may be selected as the optical plate 130 depending on whether or not reducing the thickness of the backlight unit 100 is more important than increasing the transmittance of light.

The backlight unit 100 may further include a brightness enhancement film (BEF) 150 to improve a directionality of light passing through the transmissive diffusion plate 140 and a polarization enhancement film 170 to increase a polarization efficiency.

The BEF 150 is used to refract and focus light beams passing through the transmissive diffusion plate 140, thereby increasing the directionality and the brightness of the light. The polarization enhancement film 170 transmits one polarized light (e.g., p-polarized light) while reflecting another polarized light (e.g., s-polarized light) thus allowing most of the light incident thereon to be converted into the p-polarized light as the incident light leaves the polarization enhancement film 170.

Figure 8:
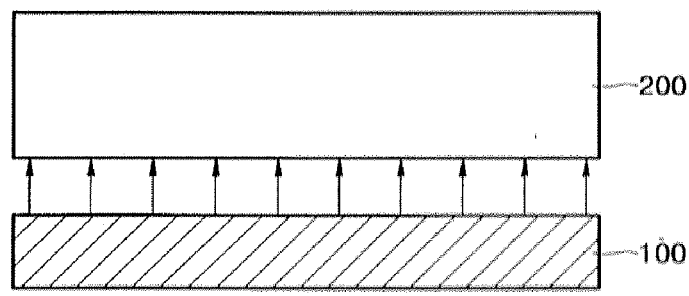
FIG. 8 schematically illustrates a liquid crystal display (LCD) apparatus including the backlight unit of FIG. 7.

FIG. 8 schematically illustrates an LCD apparatus including the backlight unit 100. Referring to FIG. 8, the LCD apparatus includes the backlight unit 100 and a liquid crystal panel 200 disposed above the backlight unit 100. As should be known in the art, when one linearly polarized light is incident on a liquid crystal layer in a liquid crystal panel, a direction of a liquid crystal director and a polarization direction of the light are changed by an applied electric field, thereby enabling image information to be displayed on the liquid crystal panel. Thus, the liquid crystal panel 200 is coupled to a driving circuitry. Since a detailed configuration of the liquid crystal panel 200 and a display operation using the driving circuitry should be known in the art, a description thereof will not be provided.

Since efficiency of light utilization is improved when the light incident on the liquid crystal panel 200 has a single polarization, using the polarization enhancement film 170 in the backlight unit 100 can increase optical efficiency.

As described above, the backlight unit 100 includes an array of side light-emitting devices 10 (10') (see FIGS. 3, 5, and 7) as point light sources, which emit most light in a direction that is lateral or approximately lateral so that the light can be spread out widely. The backlight unit 100 having the structure described above has a sufficiently reduced thickness, yet still provides uniform light intensity distribution across an entire surface thereof. Although the various embodiments described above refer to the "upward" and "downward" directions with respect to the backlight unit 100 and the side light-emitting device 10 (10'), it should be understood that these directions are reference directions and are not intended to limit the scope of the present general inventive concept. For example, the upward and downward directions may actually be horizontal when the backlight unit 100 is arranged and mounted in an LCD apparatus in an upright position for viewing.

Thus, an LCD apparatus such as an LCD TV employing the backlight unit 100 enables a display of a high quality image with uniform brightness across an entire screen thereof.

Since a side light-emitting device according to various embodiments of the present general inventive concept can emit most light in the lateral direction, using the side light-emitting device as a light source in a backlight unit directs light to be mixed more evenly.

The various embodiments of the present general inventive concept provides a slim backlight unit that uses a side light-emitting device as a point light source to provide high quality light having a uniform intensity distribution across an entire surface thereof. The various embodiments of the present general inventive concept also provide an LCD apparatus employing the backlight unit to produce a high quality image having a uniform brightness across an entire screen thereof. Additionally, since the side light-emitting device has a simple structure and is easy to manufacture, the backlight unit including the side light-emitting device and the LCD apparatus employing the backlight unit can be manufactured at significantly low costs.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A side light-emitting device, comprising:
   a light-emitting device to generate light; and
   a side emitter to emit the light incident from the light-emitting device in a lateral direction, the side emitter comprising:
   a first reflecting surface to reflect the light emitted from the light-emitting device into the side emitter,
   a second reflecting surface formed at a portion of the side emitter that contacts the light-emitting device to reflect a first light reflected from the first reflecting surface in the lateral direction, and
   a refracting surface to refract a second light that is reflected from the first reflecting surface and proceeds directly toward the refracting surface and the first light that is reflected from the first reflecting surface to the second reflecting surface and is reflected from the second reflecting surface to exit the side emitter in the lateral direction.

2. The device of claim 1, wherein at least one of the first and second reflecting surfaces is coated with a reflective coating.

3. The device of claim 1, wherein the first reflecting surface comprises a conical surface centered around a central axis of the side light-emitting device to reflect incident light in a direction away from the central axis.

4. The device of claim 3, wherein a distance of the second reflecting surface from the first reflecting surface increases as the first reflecting surface extends away from the central axis of the side light-emitting device.

5. The device of claim 4, further comprising:
   a projection disposed on a bottom center portion of the second reflecting surface.

6. The device of claim 1, wherein the first and second reflecting surfaces are inclined in the opposite directions with respect to an axis that is perpendicular to a central axis of the side light-emitting device.

7. The device of claim 6, wherein one or more of the first and second reflecting surfaces is symmetric about the central axis of the side light-emitting device.

8. The device of claim 6, wherein the second reflecting surface has a slighter inclination than the first reflecting surface.

9. The device of claim 3, wherein the second reflecting surface is planar.

10. The device of claim 1, wherein the refracting surface is not parallel to a central axis of the side light-emitting device.

11. A side light emitting device, comprising:
    a point light source;
    a side emitter having first and second reflective surfaces extending away from a central axis of the side light emitting device to respectively define upper and lower boundaries of a transparent medium and having a predetermined distance therebetween that increases as the first and second reflective surfaces extend away from the central axis of the side light emitting device; and
    a cylindrical body having a smooth refractive surface to connect respective outer peripheries of the first and second reflective surfaces, to receive laterally reflected light beams, and to transmit the laterally reflected light beams,
    wherein the point light source emits light into the side emitter, and a first portion of the emitted light is reflected by the first reflective surface substantially along a lateral axis, and a second portion of the emitted light is reflected by both the first reflective surface and the second reflective surface substantially along the lateral axis.

12. The device of claim 11, wherein the first reflective surface forms a conical shape extending downward into the cylindrical body.

13. The device of claim 11, wherein the second reflective surface extends radially inward from the cylindrical body having the smooth refractive surface to a periphery of an incident region, the incident region formed about the central axis to receive light emitted by the point light source.

14. The device of claim 11, wherein the side emitter comprises a transparent body having an incident region about the central axis of the side light emitting device, and the first and second reflective surfaces extend away from the incident region in a plurality of radial directions around the central axis.

15. The device of claim 14, wherein the point light source is disposed on a lower surface of the incident region to emit a plurality of light beams into the side emitter such that the plurality of light beams are reflected by the first and second reflective surfaces in the incident region to propagate in the plurality of radial directions along the lateral axis.

16. The device of claim 11, wherein the side light emitting device further comprises:
a cylindrical projection disposed between the point light source and the side emitter to limit an entrance angle into the side emitter of light emitted by the point light source.

17. The device of claim 11, wherein the first reflective surface has a positive incline with respect to a horizontal axis and is partially curved, and the second reflective surface has one of a negative incline with respect to the horizontal axis and no incline with respect to the horizontal axis.

18. The device of claim 11, wherein the side emitter comprises a transparent body, and the first and second reflective surfaces each comprise one of a total internal reflection surface and a surface having a reflective coating.

19. A side light emitting device, comprising:
a side emitter, including:
a transparent body, the transparent body being bound at an upper part by a first reflective surface and a lower part by a second reflective surface such that the first and second reflective surfaces meet at a central axis of the transparent body and have first and second inclinations with respect to a lateral axis, respectively, and at an outer side part by a smooth truncated conical refractive surface to connect the first and second reflective surfaces opposite to the central axis,
wherein a first peripheral edge of the refractive surface is at a radial distance from the central axis unequal to a radial distance from the central axis of a second peripheral edge of the refractive surface.

20. A backlight unit comprising:
an array of the side light-emitting devices disposed on a base plate to generate light, each of the side light-emitting devices including a side emitter to emit the light incident from the light-emitting device in a lateral direction and having a first reflecting surface to reflect light emitted from the light-emitting device into the side emitter, a second reflecting surface formed at a portion of the side emitter that contacts the light-emitting device to reflect a first light that is reflected from the first reflecting surface in the lateral direction, and a refracting surface to refract a second light that is reflected from the first reflecting surface and proceeds directly toward the refracting surface and the first light that is reflected from the first reflecting surface to the second reflecting surface and is reflected from the second reflecting surface to exit the side emitter in the lateral direction;
a reflective diffusion plate disposed on a lower side of the side light-emitting devices to reflect and diffuse incident light that propagates downward; and
a first transmissive diffusion plate disposed above the side light-emitting devices to transmit and diffuse incident light that propagates upward.

21. The backlight unit of claim 20, wherein at least one of the first and second reflecting surfaces is coated with a reflective coating.

22. The backlight unit of claim 20, wherein the first reflecting surface comprises a conical surface centered around a central axis of the side light-emitting device to reflect incident light in a direction away from the central axis.

23. The backlight unit of claim 22, wherein a distance of the second reflecting surface from the first reflecting surface that increases further away from the central axis of the side light-emitting device.

24. The backlight unit of claim 23, wherein the side light-emitting device further comprises a projection disposed on a bottom center portion of the second reflecting surface.

25. The backlight unit of claim 20, wherein the first and second reflecting surfaces are inclined in the opposite directions with respect to an axis that is perpendicular to a central axis of the side light-emitting device.

26. The backlight unit of claim 25, wherein one or more of the first and second reflecting surfaces are symmetric about the central axis of the side light-emitting device.

27. The backlight unit of claim 25, wherein the second reflecting surface has a slighter inclination than the first reflecting surface.

28. The backlight unit of claim 22, wherein the second reflecting surface is planar.

29. The backlight unit of claim 20, wherein the refracting surface is not parallel to a central axis of the side light-emitting device.

30. The backlight unit of claim 20, wherein the array of the side light-emitting devices include one of an alternating arrangement of side light-emitting devices to emit red, green, blue color light beams, respectively, and a plurality of side light-emitting devices to emit white light.

31. The backlight unit of claim 20, further comprising:
an optical plate; and
a plurality of reflecting mirrors disposed on one surface of the optical plate to reflect light that is emitted directly upward from the side light-emitting devices that correspond thereto.

32. The backlight unit of claim 31, wherein the optical plate comprises one of a transparent polymethyl methacrylate (PMMA) and a second transmissive diffusion plate.

33. The backlight unit of claim 32, further comprising at least one of:
a brightness enhancement film (BEF) to improve a directionality of light passing through the first transmissive diffusion plate; and
a polarization enhancement film to increase efficiency of polarization.

34. A backlight unit usable with a display panel apparatus, the backlight unit comprising:
a base plate; and
a plurality of side light emitting devices disposed on the base plate to emit light beams, each of the plurality of side light emitting devices including:
a point light source, and
a side emitter having first and second reflective surfaces extending away from a central axis of the side light emitting device to respectively define upper and lower boundaries thereof and having a predetermined distance therebetween that increases further away from the central axis of the side light emitting device; and a cylindrical body having a smooth refractive surface connecting respective outer peripheries of the first and second reflective surfaces entirely, to receive laterally reflected light beams, and to transmit the laterally reflected light beams.

35. The backlight unit of claim 34, further comprising one or more of:

a reflective diffusion plate disposed between the plurality of side light emitting devices and the base plate to reflect and diffuse light beams that propagate downward from the plurality of light emitting devices;

an optical plate disposed above the plurality of light emitting devices having a plurality of reflectors disposed on a bottom surface thereof to correspond to the plurality of side light emitting devices to reflect light propagating upward from the plurality of side light emitting devices downward to the corresponding plurality of side light emitting devices;

a transmission diffusion plate disposed above the base plate to receive incident light and to transmit and diffuse the incident light;

a brightness enhancement film (BEF) disposed above the base plate to receive incident light and to improve a directionality of the incident light; and an enhancement film disposed above the base plate to receive incident light and to increase polarization efficiency of the incident light.

36. A liquid crystal display apparatus comprising:

a liquid crystal panel; and a backlight unit to emit light to the liquid crystal panel, the backlight unit including:

an array of the side light-emitting devices disposed on a base plate to generate light, each of the side light-emitting devices including a side emitter to emit the light incident from the light-emitting device in a lateral direction and having a first reflecting surface to reflect light emitted from the light-emitting device into the side emitter, a second reflecting surface formed at a portion of the side emitter that contacts the light-emitting device to reflect a first light that is reflected from the first reflecting surface in the lateral direction, and a refracting surface to refract a second light that is reflected from the first reflecting surface and proceeds directly toward the refracting surface and the first light that is reflected from the first reflecting surface to the second reflecting surface and is reflected from the second reflecting surface to exit the side emitter in the lateral direction, a reflective diffusion plate disposed on a lower side of the side light-emitting devices to reflect and diffuse incident light that propagates downward, and a first transmissive diffusion plate disposed above the side light-emitting devices to transmit and diffuse incident light that propagates upward.

37. The apparatus of claim 36, wherein at least one of the first and second reflecting surfaces is coated with a reflective coating.

38. The apparatus of claim 36, wherein the first reflecting surface comprises a conical surface centered on a central axis of the side light-emitting device to reflect incident light in a direction away from the central axis.

39. The apparatus of claim 38, wherein a distance of the second reflecting surface from the first reflecting surface increases further away from the central axis of the side light-emitting device.

40. The apparatus of claim 39, wherein the side light-emitting device further comprises a projection disposed on a bottom center portion of the second reflecting surface.

41. The apparatus of claim 36, wherein the first and second reflecting surfaces are inclined in opposite directions with respect to an axis that is perpendicular to a central axis of the side light-emitting device.

42. The apparatus of claim 41, wherein one or more of the first and second reflecting surfaces are symmetric about the central axis of the side light-emitting device.

43. The apparatus of claim 41, wherein the second reflecting surface has a slighter inclination than the first reflecting surface.

44. The apparatus of claim 38, wherein the second reflecting surface is planar.

45. The apparatus of claim 36, wherein the retracting surface is not parallel to a central axis of the side light-emitting device.

46. The apparatus of claim 36, wherein the array of the side light-emitting devices include one of an alternating arrangement of the side light-emitting device to emit red, green, and blue color light beams, respectively, and a plurality of the side light-emitting devices to emit white light.

47. The apparatus of claim 36, wherein the back light unit further comprises:

an optical plate; and a plurality of reflecting mirrors disposed on one surface of the optical plate to reflect light emitted directly upward from the side light-emitting devices that correspond thereto.

48. The apparatus of claim 47, wherein the optical plate comprises one of a transparent polymethyl methacrylate (PMMA) and a second transmissive diffusion plate.

49. The apparatus of claim 36, wherein the backlight unit further comprises at least one of:

a brightness enhancement film (BEF) to improve a directionality of light passing through the first transmissive diffusion plate; and a polarization enhancement film to increase efficiency of polarization.

50. A display panel apparatus, comprising:

a display panel; and a backlight unit disposed adjacent to the display panel and to provide light to the display panel, the backlight unit including:

a base plate, and a plurality of side light emitting devices disposed on the base plate to emit light beams, and each of the plurality of side light emitting devices having a point light source, and a side emitter having first and second reflective surfaces extending away from a central axis of the side light emitting device to respectively define upper and lower boundaries of a transparent body and having a predetermined distance therebetween that increases while extending further way from the central axis of the side light emitting device, the side emitter including cylindrical body having a smooth refractive surface connecting respective outer peripheries of the first and second reflective surfaces entirely, to receive laterally reflected light beams, and to transmit the laterally reflected light beams.

51. A side light emitting device comprising;

a base defining a plane at an upper surface thereof;

a light source disposed on the upper surface of the base at a central axis perpendicular to the plane to emit first light rays and second light rays;

a smooth truncated conical refracting surface circumferentially formed about the base to refract light rays passing therethrough in a direction substantially perpendicular to the central axis;

an upper reflecting surface connected at an outer periphery thereof to a first peripheral edge of the refracting surface, the upper reflecting surface to reflect the first light rays towards the plane and to reflect the second light rays towards the refractive surface; and a lower reflecting surface connected at an outer periphery thereof to a second peripheral edge of the refracting surface to reflect the first light rays that are reflected from the upper reflecting surface toward the refracting surface, wherein the first peripheral edge of the refracting surface is at a radial distance from the central axis unequal to a radial distance from the central axis of the second peripheral edge of the refracting surface.

52. The side light emitting device of claim 51, wherein the lower reflecting surface is in physical contact with the base.

* * * * *